US007841071B2

(12) United States Patent
Jeserer

(10) Patent No.: US 7,841,071 B2
(45) Date of Patent: Nov. 30, 2010

(54) POSITION-CORRECTION DEVICE FOR CORRECTING THE POSITION OF A COMPONENT HOLDER FOR ELECTRONIC COMPONENTS

(75) Inventor: Gunther Jeserer, Kolbermoor (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 193 days.

(21) Appl. No.: 11/288,078

(22) Filed: Nov. 29, 2005

(65) Prior Publication Data
US 2006/0155396 A1 Jul. 13, 2006

(30) Foreign Application Priority Data
Nov. 30, 2004 (DE) .................. 10 2004 057 776

(51) Int. Cl.
*G01R 31/28* (2006.01)
(52) U.S. Cl. .................. 29/739; 29/743; 324/758
(58) Field of Classification Search ............... 700/114, 700/213, 56, 57, 60, 254, 192, 193, 121; 29/739, 701, 709, 714, 760, 834, 836, 743; 324/758, 765, 755
See application file for complete search history.

(56) References Cited

U.S. PATENT DOCUMENTS

| 4,610,442 | A | * | 9/1986 | Oku et al. ..................... 269/73 |
| 5,150,041 | A | | 9/1992 | Eastin et al. |
| 5,172,922 | A | * | 12/1992 | Kowaleski et al. ............. 279/3 |
| 5,177,864 | A | | 1/1993 | Oyama |
| 5,442,299 | A | * | 8/1995 | Caggiano ..................... 324/758 |
| 5,864,944 | A | * | 2/1999 | Kashiwagi et al. ............ 29/833 |

* cited by examiner

Primary Examiner—A. Dexter Tugbang
Assistant Examiner—Livius R Cazan
(74) Attorney, Agent, or Firm—Christie, Parker & Hale, LLP

(57) ABSTRACT

In the case of a position-correction device for correcting the position of a component holder of a handling apparatus for electronic components, in particular ICs, a base plate and a centering frame which can be displaced in relation to the base plate are provided in the region of a contact unit. A drive device is also provided and is operatively connected to the centering frame in order to displace the centering frame and thus the component holder inserted into the centering frame as a function of correction values which are calculated by a computation device on the basis of measured values which are obtained by a position-detection device for detecting the actual position of the component which is to be tested and is held in the component holder.

11 Claims, 5 Drawing Sheets

Figure 1:
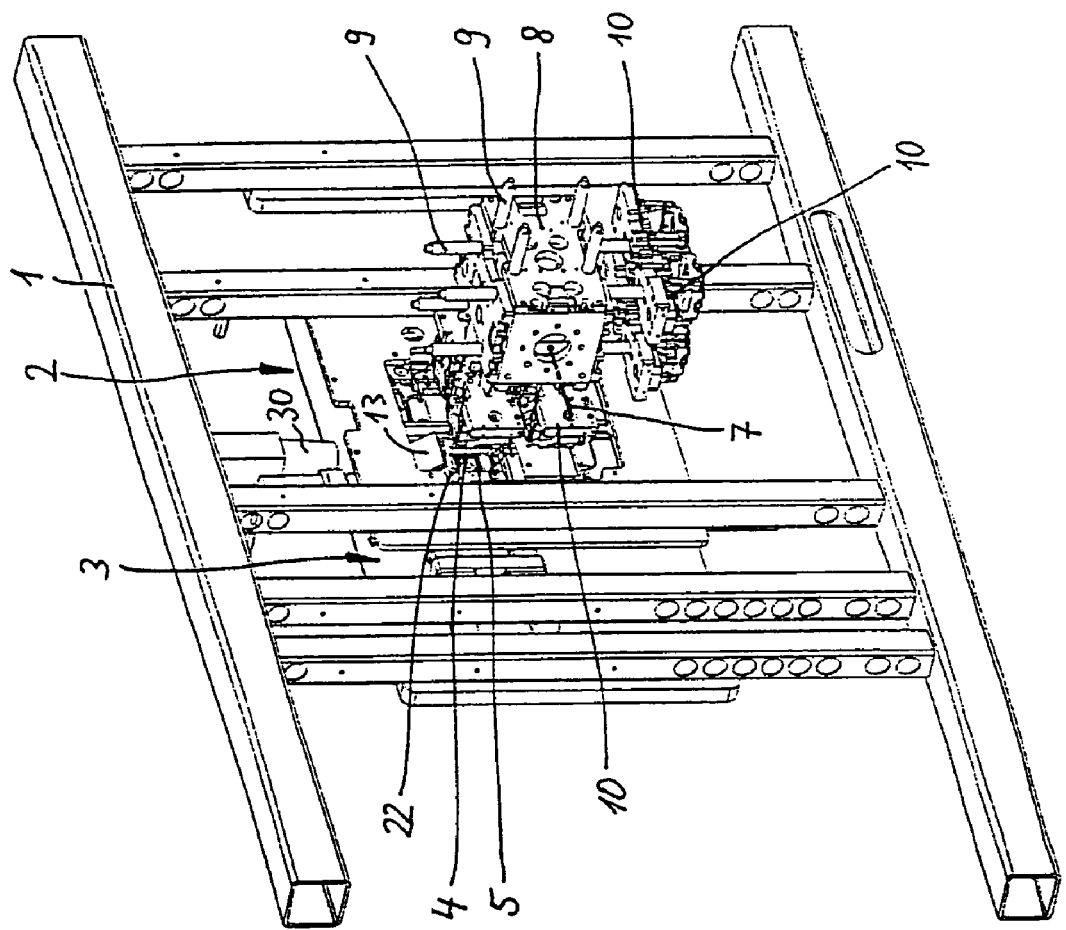

POSITION-CORRECTION DEVICE FOR CORRECTING THE POSITION OF A COMPONENT HOLDER FOR ELECTRONIC COMPONENTS

The invention relates to a position-correction device for correcting the position of a component holder of a handling apparatus for electronic components, in particular integrated circuits (ICs).

The electrical characteristics of electronic components such as ICs are tested in the customary manner before said ICS are mounted on printed circuit boards or fitted in devices. In this process, the electronic components are firstly removed from component carriers, which are composed of aluminum plates for example, and passed to a testing apparatus by an automatic handling apparatus (handler). A contact unit which has a fixed base plate and a contact base mounted on the base plate is known to be present in the interface region between the handling apparatus on the one hand and the testing apparatus on the other. The contact base is fitted with a large number of contacts which are matched to the connection contacts of the component to be tested and which can be electrically connected to the testing apparatus.

When the components are passed to the test base by means of the component holder of the handling apparatus, it is very important that the connection contacts of the component to be tested are placed precisely in the center of the associated contacts of the contact base. This requires a very high degree of precision since the connection contacts of the components are designed to be very small and are close to one another on account of the need for miniaturization. This causes difficulties in practice since the components naturally have dimensional tolerances in terms of their outer contours and the position of the components within the component holder is not always the same.

The invention is based on the object of providing a position-correction device of the type mentioned in the introduction which ensures that the component is correctly positioned in relation to the contact base in a simple and very precise manner.

The position-correction device according to the invention has the following features:
- a centering frame is provided, bounds an insertion opening for the component holder on at least two sides and is arranged in the region of a contact unit;
- the contact unit has a fixed base plate and a contact base which is mounted on the base plate and has contacts which can be electrically connected to a testing apparatus;
- a position-detection device for detecting the actual position of the component which is to be tested and is held in the component holder is provided;
- a computation device for calculating position-correction values from the difference between the actual position and a setpoint position of the component is provided;
- the centering frame is arranged such that it can be displaced in relation to the base plate; and
- a drive device is provided and is operatively connected to the centering frame in order to displace the centering frame and thus the component holder as a function of the correction values calculated by the computation device such that the component moves to its setpoint position in relation to the contact base.

By means of the position-correction device according to the invention, it is possible to move the component to be tested exactly into the correct position immediately before it makes contact with the contact base, so that the connection contacts of the component come to rest precisely on the contacts of the contact base.

The position-detection device for detecting the actual position of the component expediently comprises an optical measurement system, that is to say a camera device, with which the actual position of the component is measured preferably immediately before the component holder is inserted into the centering frame. Since the position correction performed on the basis of this measurement is also carried out immediately before the component holder is inserted into the centering frame and thus in the immediate vicinity of the contact base, displacements in the position of the component within the component holder, which may occur when the component is being transferred to the contact base, do not have any effect in this case.

According to one advantageous embodiment, the insertion opening for the component holder is bounded by the centering frame on two adjacent sides and by the base plate on the remaining sides. In this case, spring means are provided on the base plate, bear against the side of the inserted component holder and push it against the centering frame. This embodiment firstly permits simple, cost-effective production and secondly ensures that the component holder is inserted into the insertion opening in a simple manner.

According to one advantageous embodiment, adjustable bearing elements which project into the insertion opening are attached to the centering frame, and the inserted component holder bears against these bearing elements. The relative position of various component holders can be easily matched to the centering frame by means of adjustable bearing elements of this type.

Insertion of the component holder into the insertion opening is made easier when the bearing elements have run-on slopes on their side which faces the component holder.

According to one advantageous embodiment, the centering frame is arranged on the base plate such that its main plane runs parallel to the main plane of the base plate, with the centering frame being held on the base plate by retaining bolts which penetrate holes in the centering frame with lateral play. This allows the centering frame to be held on the base plate in a simple manner.

According to one advantageous embodiment, the drive device has three movable operating members which engage on the side of the centering frame at three spaced apart locations and thus determine the relative position of the centering frame in relation to the base plate. It is advantageous here when the centering frame can be moved in at least one longitudinal direction and in a rotational direction by means of the drive device.

The component holder follows the correction movement of the centering frame in a simple manner when the component holder has a supporting plate which can be inserted into the insertion opening and is mounted in floating fashion in relation to a piston rod of the handling apparatus.

Figure 2:
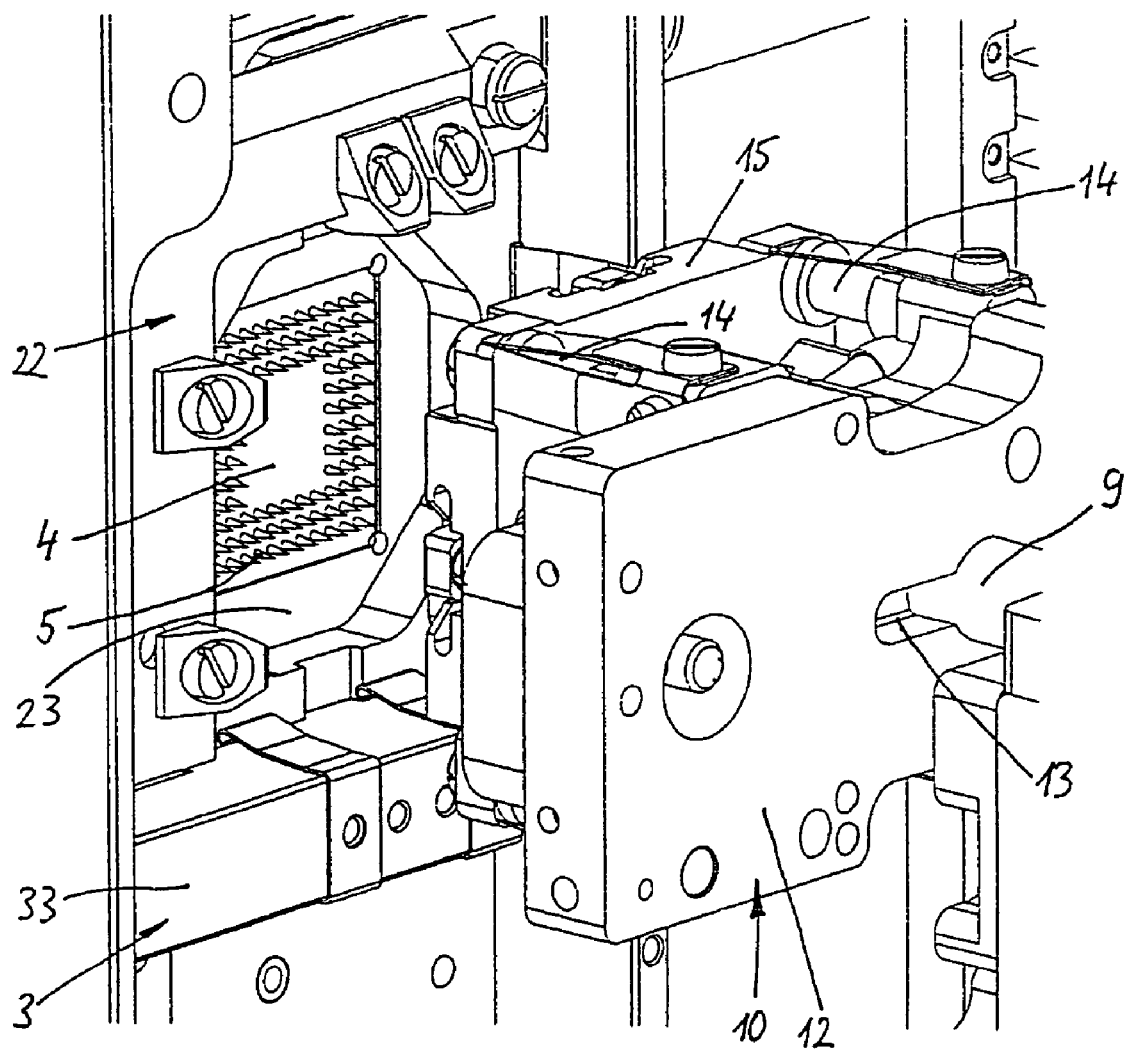
Figure 3:
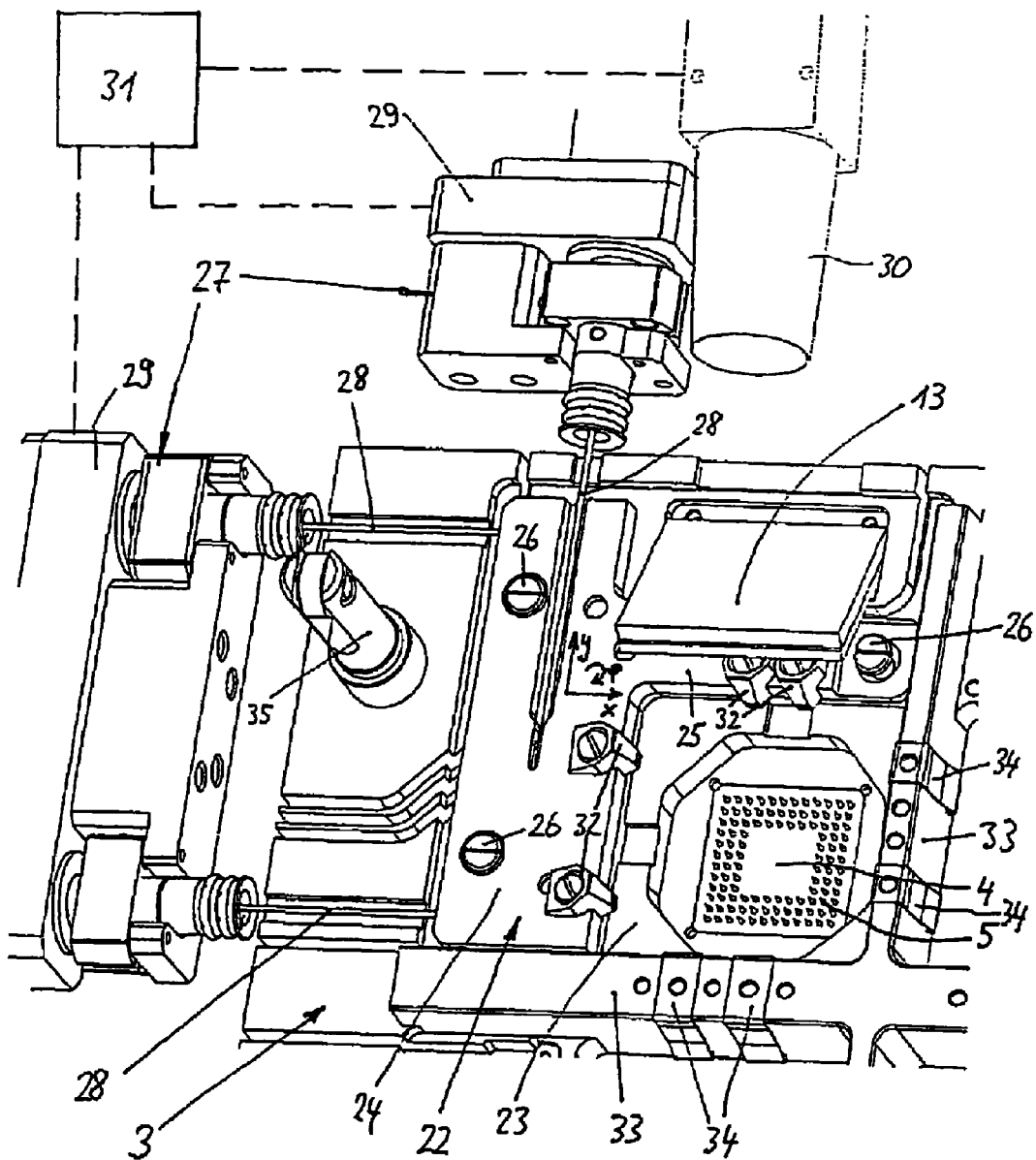
Figure 5:
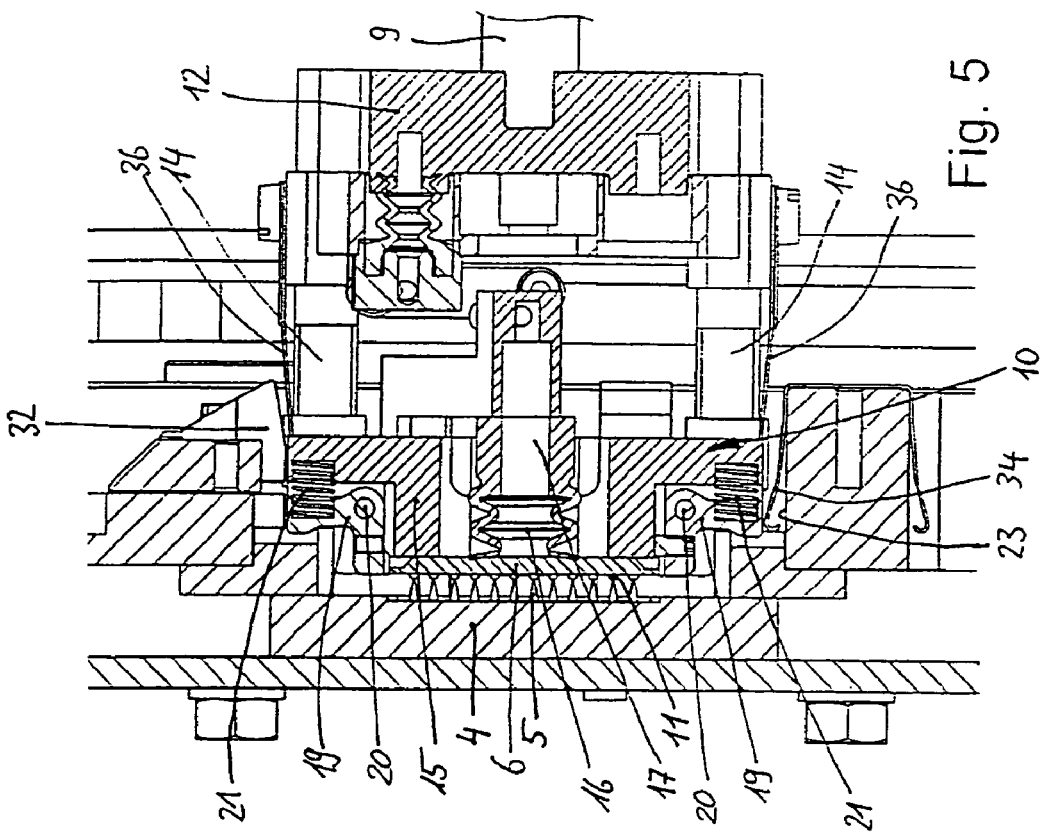
Figure 4:
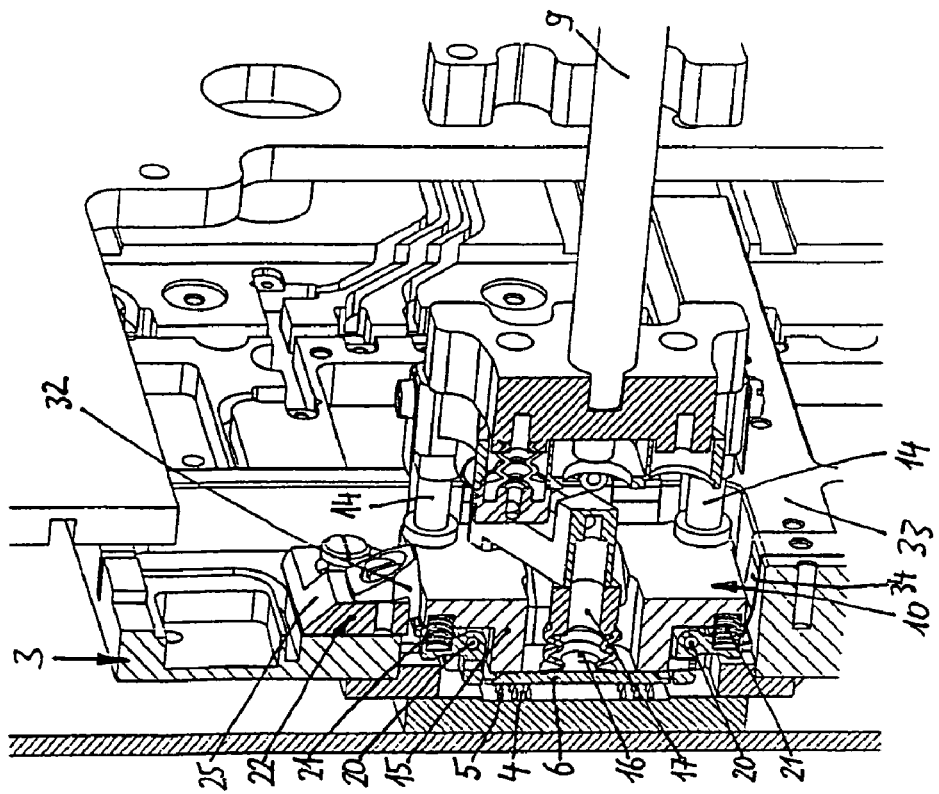
Figure 6:
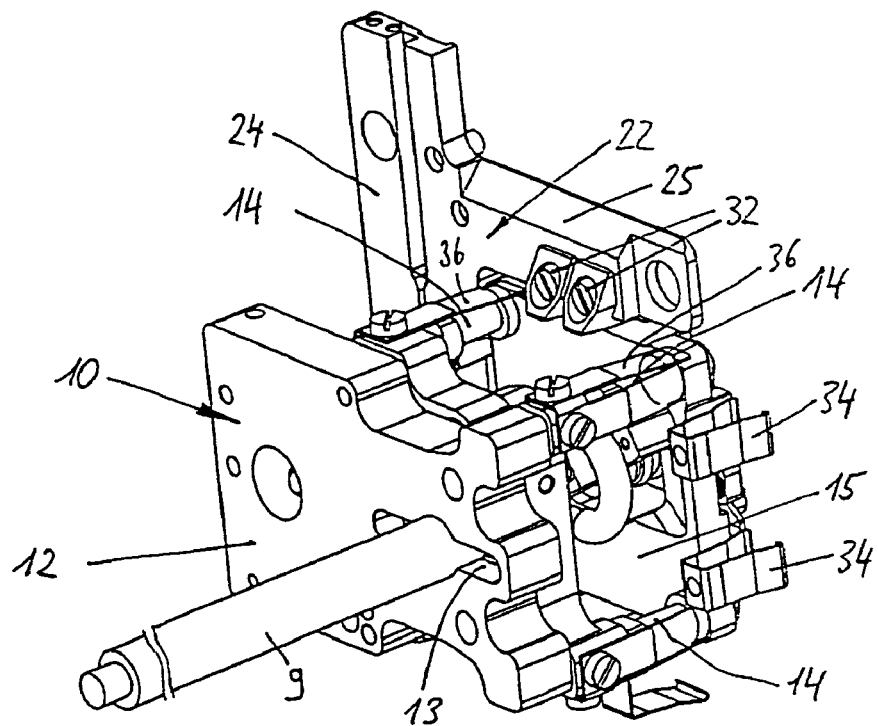
Figure 7:
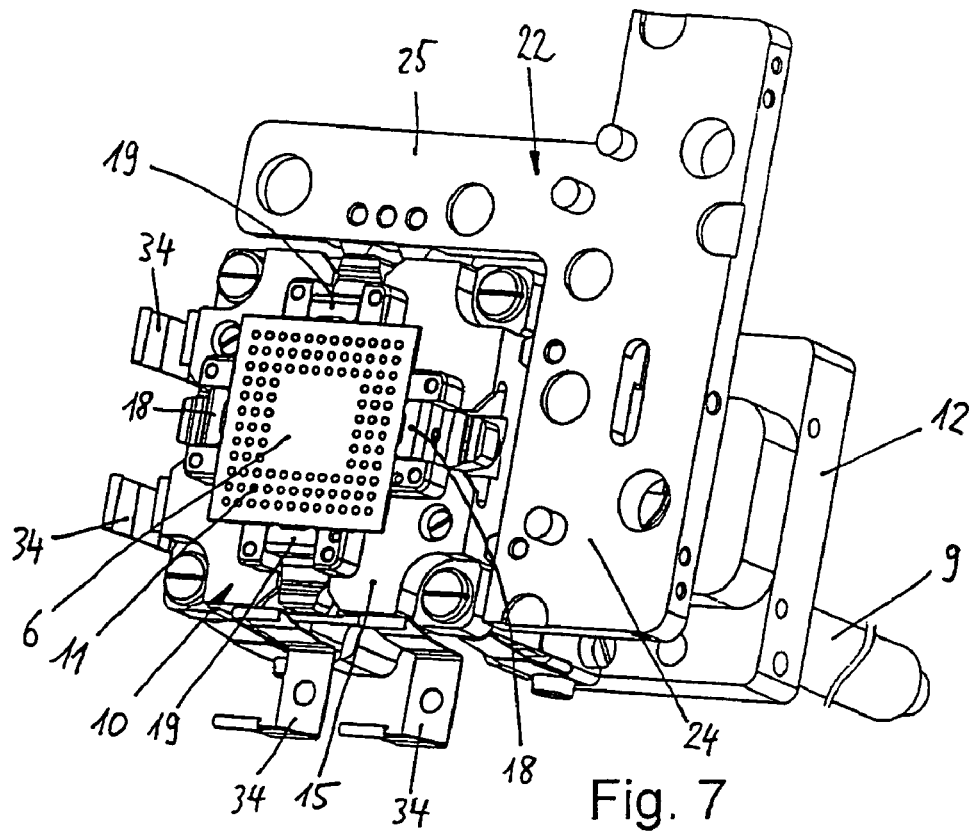

The invention is explained by way of example and in greater detail below with reference to the drawings, in which:

FIG. 1: shows a contact unit with a base plate and a rotatable rotary body of a handling apparatus which is fitted with a plurality of component holders;

FIG. 2: shows a component holder in the vicinity of a contact base, with the component holder just about to be inserted into the insertion opening in the centering frame;

FIG. 3: shows an oblique plan view of the centering frame, part of the base plate and part of the drive device;

FIG. 4: shows a partial section through the contact unit and the component holder when the component is placed onto the contact base;

FIG. 5: shows a two-dimensional section through the arrangement according to FIG. 4;

FIG. 6: shows an oblique front view of only the centering frame and the component holder with the piston rod during the contact-making process; and FIG. 7: shows an oblique rear view of the arrangement from FIG. 6.

FIG. 1 shows part of a frame 1 of a handling apparatus (not illustrated in any more detail) for electronic components, a so-called "handler". A contact unit 2, which has a fixed base plate 3 and a contact base 4 shown in greater detail in FIG. 2, is attached to the rear side of the frame 1. As is known, the contact base 4 is fitted with a large number of projecting contacts 5 which are cone-shaped in the illustrated exemplary embodiment but may also be formed in a different way. The contacts 5 can be used in a known manner to provide an electrical connection to a testing apparatus (not illustrated) with which the electrical characteristics of the electronic components 6 (FIGS. 4, 5, 7) are checked.

In order to be able to pass the electronic components 6 to the contact base 4, the handling apparatus has a cuboidal rotary body 8 which can pivot about a horizontal axis of rotation 7. A total of eight piston rods 9 are mounted in the rotary body 8 such that they pass all the way through and can be longitudinally displaced, with four piston rods 9 being arranged vertically and a further four piston rods 9 being arranged horizontally in the position shown in FIG. 1. A respective component holder 10 can be attached to one end of each piston rod 9 (see FIGS. 6 and 7 in particular). The component holders 10 serve the purpose of holding a respective component 6 and are described in even greater detail below. In FIG. 1, which is merely intended to provide a rough overview of some important components, the component holders 10 which point downwards and are attached to the vertical piston rods 9 are, however, shown only incompletely.

The component holders 10 can be moved independently of one another by means of their associated piston rod 9 in order to remove components 6 from component carriers (not illustrated) and, after the rotary body 8 has rotated through 90° and the position of the component 6 in the component holder 10 has been determined using an optical position-detection device 30 in the form of a camera by means of an obliquely arranged mirror 13 (FIGS. 1 and 3), to pass the components 6 to the contact base 4, so that the connection contacts 11 (FIG. 7) of the component 6 come to rest on the associated contacts 5 of the contact base 4. Once the measurement has been carried out, the component 6 is removed from the contact base 4 by withdrawing the component holder 10 again, and the rotary body 8 is then pivoted again such that the component 6 can be put back into the component carrier.

A component holder 10 is described in greater detail below with reference to FIGS. 5 to 7.

A connecting plate 12 which runs transversely is rigidly attached to the piston rod 9. A supporting plate 15 which is parallel to the connecting plate 12 is attached to the connecting plate 12 via four supports 14. The supports 14 penetrate the supporting plate 15 through holes of relatively large diameter with lateral play and engage behind the supporting plate 15, so that the supporting plate 15 can be displaced sideways to some extent in relation to the supports 14 and thus is mounted in floating fashion in relation to the remaining parts of the component holder 10. However, the supporting plate 15 is prestressed in its central position by means of spring tongues 36 (FIG. 5) which press against the side of the supporting plate 15.

In order to hold the component 6 on the lower face of the supporting plate 15, each component holder 10 has a vacuum suction means 16 which can be placed onto the upper face of the component 6 to be held and has an inner channel 17 which is at subatmospheric pressure.

In order to position the component 6 on the lower face of the supporting plate 15 in a lateral direction, the component holder 10 has a positioning device with clamping elements 18, 19 in the form of L-shaped clamping levers. These clamping elements 18, 19 can be moved from an open position, in which they are at a distance from the four side edges of the component 6, into a clamping position in which they apply pressure, which prevents lateral movement of the component 6, to the side edges of the component 6. To this end, the clamping elements 18, 19 are mounted on the supporting plate 15 such that they can pivot about pivot axes 20.

Furthermore, the clamping elements 18, 19 are prestressed in their clamping position by means of compression springs 21. If, in contrast, the component holder 10 is placed onto a component carrier (not illustrated) from which the components 6 have to be removed or in which the components 6 are to be stored again, the outwardly pointing limbs of the clamping elements 18, 19 strike the component carrier, as a result of which the clamping elements 18, 19 are opened and the component 6 is released.

In order to be able to place the component 6 to be tested in a precise position on the contact base 4 of the contact unit 2, the handling apparatus has a position-correction device for correcting the position of the component 6 to be tested immediately before contact is made with the contact base 4. This position-correction device essentially comprises a centering frame 22 which bounds an insertion opening 23 for the supporting plate 15 of the component holder 10 on two sides and which is arranged on the base plate 3 of the contact unit 2 such that its main plane runs parallel to the main plane of the base plate 3. As can be seen from FIGS. 3 and 7, the centering frame 22 is substantially L-shaped and has a limb 24 and a limb 25 which projects at right angles to said limb 24. Three retaining bolts 26 in the form of screws engage behind the centering frame 22 and hold it on the base plate 3 in this way, said retaining bolts 26 penetrating corresponding holes in the centering frame 22 which are designed to be larger than the shaft diameter of the retaining bolts 26. There is therefore lateral play between the retaining bolt 26 and the walls of the holes, so that the centering frame 22 can be slightly displaced and rotated in its main plane.

A drive device 27 is provided in order to displace the centering frame 22 in relation to the base plate 3 (FIG. 3). This drive device 27 has three spaced apart operating members 28 in the form of rods which at one end are connected to a motor unit 29 such that they can be displaced in the longitudinal direction, and at the other end are connected to the centering frame 22 at three spaced apart locations. In the exemplary embodiment shown in FIG. 3, two operating members 28 are arranged parallel to one another and attached to the side of the centering frame 22 in the two opposite end regions of the limbs 24 of said centering frame. In contrast, the third operating member 28 extends perpendicularly to the two first-mentioned operating members 28 and extends into the limb 24 from a narrow end face of said limb. This arrangement makes it possible to displace the centering frame 22 in relation to the base plate 3 in the x- or y-direction or rotate it in the φ direction by the deliberate operation of individual operating members 28.

As already explained and illustrated in FIGS. 1 and 3, the position-correction device also has an optical position-detection device 30 in the form of a camera which records the actual position of the component 6 within the component holder 10. The position-detection device 30 is connected to a computation device 31 which calculates position-correction values from the difference between the actual position and a setpoint position of the component 6 within the component holder 10. The computation device 31 is, in turn, connected to the drive device 27 (FIG. 3) and controls the drive device 27 such that, as a function of the position-correction values, the centering frame 22 and thus the insertion opening 23 are displaced into a position in which the supporting plate 15 of the component holder 10 inserted into the insertion opening 23 and thus the component 6 are precisely in the desired setpoint position.

Two sides of the supporting plate 15 of the component holder 10 inserted into the insertion opening 23 bear against bearing elements 32 which are adjustably attached to the centering frame 22 and project laterally into the insertion opening 23 via the limbs 24, 25. In order to ensure easy insertion into the insertion opening 23 and centering of the supporting plate 15, the bearing elements 32 have, for these purposes, corresponding run-on slopes on their side which faces the component 6.

The insertion opening 23 is bounded by corresponding webs 33 of the base plate 3 on the two other sides at which the limbs 24, 25 of the centering frame 22 are not present. Spring means 34 in the form of U-shaped spring clips are placed on the two webs 33 and the inner limbs of these clips project into the insertion opening 23. The inner limbs of the spring means 34 bear against the sides of the inserted component 6 and push the component 6 against the bearing elements 32 of the centering frame 22. On account of the prestressing force of the spring means 34, the component 6 is always held such that it bears against the bearing elements 32, and these spring means at the same time make it possible for the component 6 to be displaced in relation to the fixed base plate 3 together with the centering frame 22.

FIG. 3 also illustrates a centering pin 35 which projects above the base plate 3 and serves to center the base plate 3 in relation to the handling apparatus (handler).

If the component 6 has to be tested under specific temperature conditions, it is readily possible for only the centering frame 22 to be arranged in the temperature-controlled region, while the motor unit 29 is arranged outside the temperature-controlled region. This permits relatively simple motor drives and increases their service life. Another important factor is that it is not necessary for position correction to be performed using an apparatus which would have to be arranged on the component holder 10 and moved together with it, which would mean a substantially higher technical outlay.

The invention claimed is:

1. An integrated circuit component handling apparatus for automatically connecting a testing device to integrated circuit components to be tested, the integrated circuit components of the type each having first and second surfaces with plural electrical contacts disposed on the first surfaces thereof, the handling apparatus comprising:
   a contact base comprising plural electrical contacts arranged to make electrical contact with corresponding plural electrical contacts disposed on the first surface of an integrated circuit component to be tested,
   a component holder floatably mounted in relation to and distanced from the contact base and a centering frame member disposed on the contact base, the component holder applying vacuum suction to the second surface of the integrated circuit component to be tested to thereby hold the integrated circuit component as the component holder passes the integrated circuit component to the contact base so that the first surface plural electrical contacts thereof can be positioned into electrical contact with the contact base plural electrical contacts,
   the centering frame member being arranged such that it can be displaced in relation to the contact base,
   a position-detection device for detecting the position of an integrated circuit component the component holder holds with said vacuum suction,
   a computation device for calculating position-correction values from the difference between the detected position and a setpoint position of the component, and
   a drive device operatively connected to the centering frame member in order to controllably displace the centering frame member linearly and angularly and thus displace the floatable component holder linearly and angularly as a function of the correction values calculated by the computation device such that the integrated circuit component to be tested moves to its setpoint position in relation to the contact base to align the first surface plural electrical contacts thereof with the contact base plural electrical contacts.

2. The handling apparatus according to claim 1, wherein the centering frame member bounds an insertion opening for the component holder on at least two sides.

3. The handling apparatus according to claim 2, wherein the insertion opening for the component holder is bounded by the centering frame member on two adjacent sides and by a base plate on the remaining sides thereof, with spring means being provided on the base plate, bearing against at least one side of the component holder and pushing it against the centering frame.

4. The handling apparatus according to claim 2, further comprising adjustable bearing elements which project into the insertion opening and are attached to the centering frame member, and the component holder bears against these bearing elements.

5. The handling apparatus according to claim 4, wherein the bearing elements have run-on slopes on their side which faces the component holder.

6. The handling apparatus according to claim 2, wherein the component holder has a supporting plate which can be inserted into the insertion opening and is mounted in floating fashion in relation to a piston rod of the handling apparatus.

7. The handling apparatus according to claim 1, further comprising a base plate, wherein the centering frame member is arranged on the base plate such that its main plane runs parallel to the main plane of the base plate, with the centering frame member being held on the base plate by retaining bolts which penetrate holes in the centering frame member with lateral play.

8. The handling apparatus of claim 7, wherein said drive device linearly displaces the centering frame member in relation to the base plate in the x-direction and the y-direction and rotates the centering frame member in the $\phi$ direction.

9. The handling apparatus of claim 1 wherein the drive device comprises a motor unit and three operating members in the form of rods, each rod being drivingly connected to the motor unit to be displaced independently of the other rods in its longitudinal direction and having one end connected to the centering frame member, wherein two of said rods are arranged parallel to each other and engage one first side of the centering frame member, the third rod engaging a second side of the centering frame member, to displace and rotate the centering frame member.

10. The handling apparatus of claim 1, wherein said component holder is withdrawable from the contact base and from the centering frame member after contact.

11. The handling apparatus of claim 1, wherein said component holder includes a vacuum suction means for holding the integrated circuit component and is mounted floatably in relation to the handling apparatus in a manner that, by passing the integrated circuit component to the contact base, the positioning of the component holder in an x, y and φ direction is defined by the correction movement of the centering frame member in the x, y and φ direction, respectively, and said component holder is withdrawable from the contact base and from the centering frame member after contacting.

* * * * *